United States Patent
Veroni et al.

(10) Patent No.: US 7,598,720 B2
(45) Date of Patent: Oct. 6, 2009

(54) METHOD AND SYSTEM FOR DETECTING THE PHASE OF WIRING OF AN UNKNOWN PHASE VOLTAGE RELATIVE TO A REFERENCE PHASE VOLTAGE

(75) Inventors: Fabio Veroni, Vimercate-Milano (IT); Paolo Giubbini, Rome (IT)

(73) Assignee: Enel Distribuzione S.p.A., Rome (IT)

( * ) Notice: Subject to any disclaimer, the term of this patent is extended or adjusted under 35 U.S.C. 154(b) by 0 days.

(21) Appl. No.: 11/659,704

(22) PCT Filed: Aug. 16, 2004

(86) PCT No.: PCT/EP2004/009185
§ 371 (c)(1),
(2), (4) Date: Feb. 8, 2007

(87) PCT Pub. No.: WO2006/018031
PCT Pub. Date: Feb. 23, 2006

(65) Prior Publication Data
US 2007/0247139 A1      Oct. 25, 2007

(51) Int. Cl.
*G01R 19/00* (2006.01)
(52) U.S. Cl. .............. 324/66; 324/76.52; 324/76.77; 324/86; 324/107; 324/531; 340/870.1
(58) Field of Classification Search .............. 324/66, 324/76.52, 76.77
See application file for complete search history.

(56) References Cited

U.S. PATENT DOCUMENTS

| | | | | |
|---|---|---|---|---|
| 3,940,558 A | * | 2/1976 | Gabbard et al. | 375/356 |
| 4,011,503 A | * | 3/1977 | Ferrara | 324/76.77 |
| 4,626,622 A | * | 12/1986 | Bouvrette | 379/93.37 |
| 5,510,700 A | * | 4/1996 | Pomatto | 324/66 |
| 5,521,491 A | * | 5/1996 | Najam | 324/86 |

(Continued)

FOREIGN PATENT DOCUMENTS

DE      44 05 809 A1      8/1995

(Continued)

OTHER PUBLICATIONS

Technical Report, CEI/IEC 61334-5-2, May 1998.

(Continued)

*Primary Examiner*—Timothy J Dole
*Assistant Examiner*—Benjamin M Baldridge
(74) *Attorney, Agent, or Firm*—Nixon & Vanderhye P.C.

(57) ABSTRACT

A system detects the wiring phase of an unknown phase voltage at a remote location relative to a reference phase voltage at a reference location in an electrical power distribution system having a single phase or poly phase power line. A transmitter transmits a signal from the reference location to the remote location. The signal comprises a characteristic signal pattern. Moreover, a first circuit detects at the remote location the characteristic signal pattern of the signal and determines a first time interval between the characteristic signal pattern and the occurrence of a reference point in the unknown phase voltage. A second circuit determines at the reference location a second time interval between the characteristic signal pattern and the occurrence of a reference point in the reference phase voltage. The system determines the wiring phase of the unknown phase voltage from the first time interval and the second time interval.

22 Claims, 5 Drawing Sheets

U.S. PATENT DOCUMENTS

| | | | |
|---|---|---|---|
| 5,617,329 A * | 4/1997 | Allison et al. | 700/286 |
| 6,545,481 B1 | 4/2003 | Emberty et al. | |
| 6,734,658 B1 * | 5/2004 | Bierer | 324/115 |
| 2003/0161391 A1* | 8/2003 | Andre et al. | 375/219 |
| 2003/0169029 A1* | 9/2003 | Piesinger | 324/66 |
| 2005/0069171 A1* | 3/2005 | Rhoads et al. | 382/100 |
| 2008/0116877 A1* | 5/2008 | Giubbini et al. | 324/84 |

FOREIGN PATENT DOCUMENTS

| | | |
|---|---|---|
| TW | 380206 | 5/1998 |
| TW | 388795 | 5/2000 |

OTHER PUBLICATIONS

U.S. Appl. No. 11/597,518, filed Nov. 27, 2006; Inventor: Giubbini et al.

Translation of Chinese official action, Feb. 6, 2009, in corresponding Chinese Application No. 2004800442054.

* cited by examiner

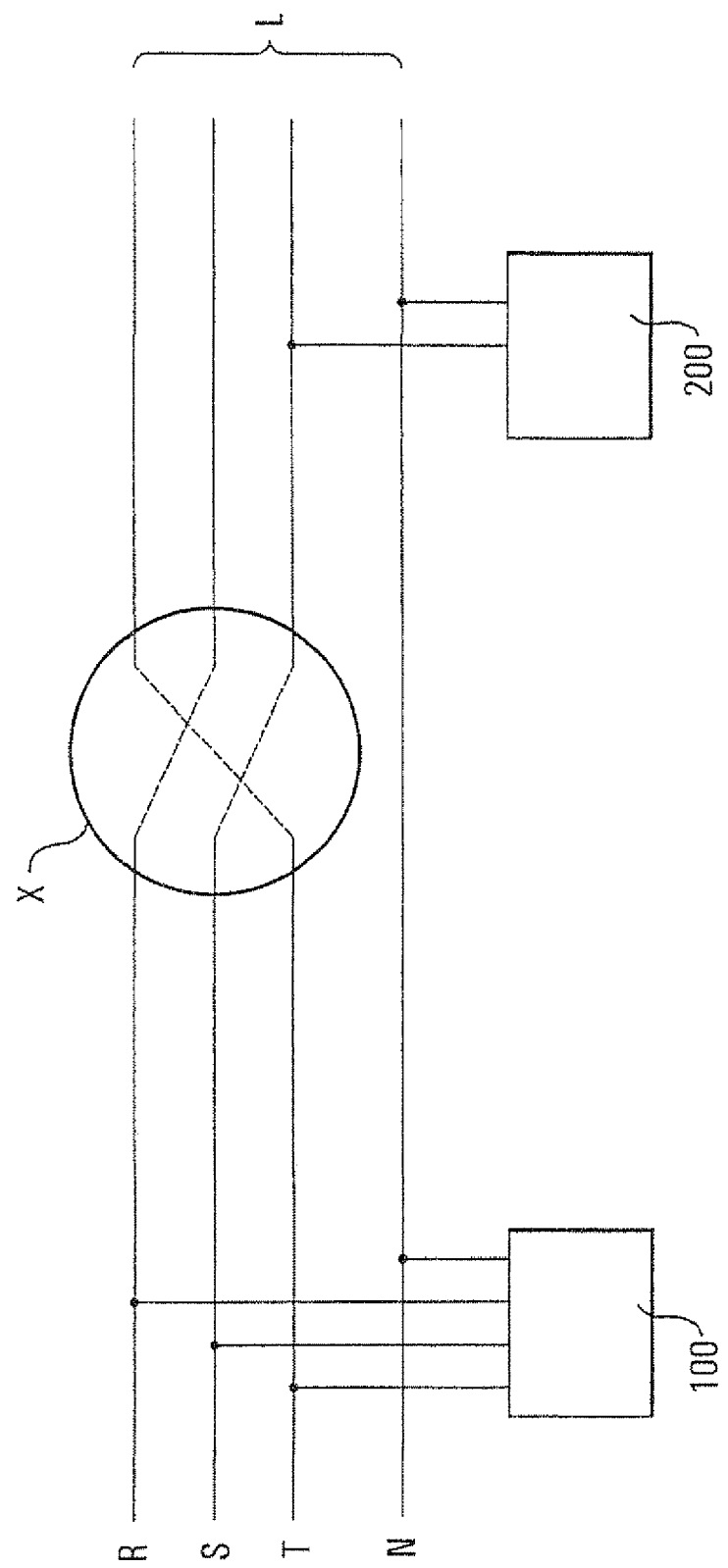

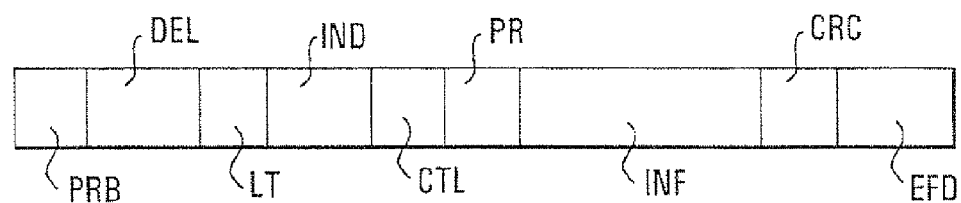
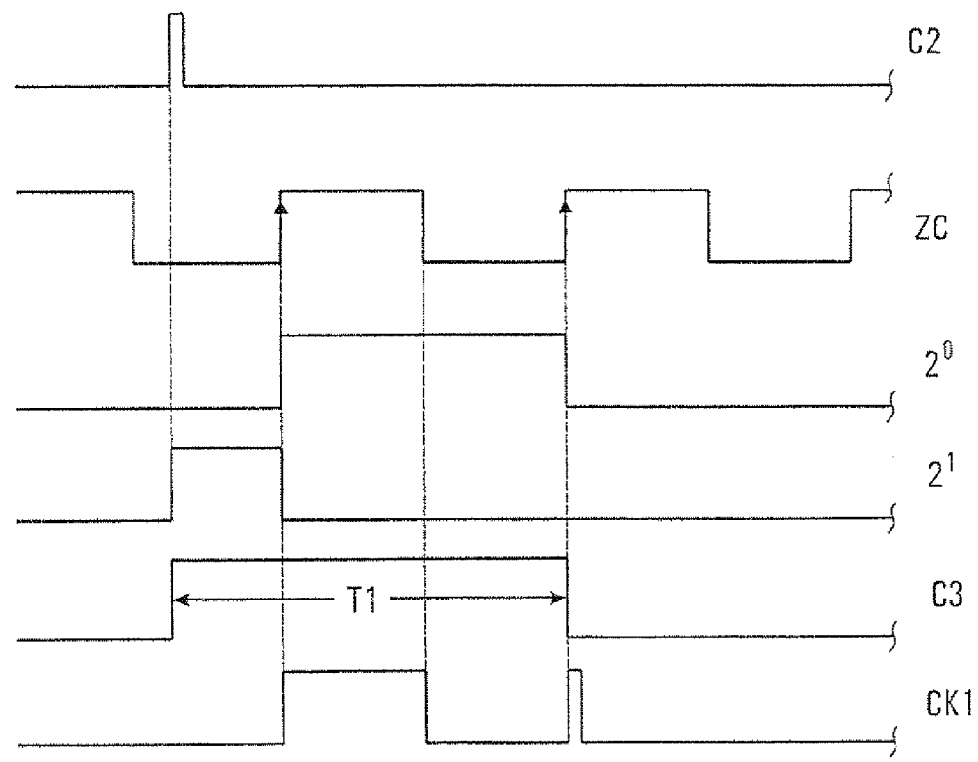

METHOD AND SYSTEM FOR DETECTING THE PHASE OF WIRING OF AN UNKNOWN PHASE VOLTAGE RELATIVE TO A REFERENCE PHASE VOLTAGE

This application is the US national phase of international application PCT/EP2004/009185 filed 16 Aug. 2004, which designated the U.S., the entire contents of each of which are hereby incorporated by reference.

The following description relates to a method and an apparatus for detecting the wiring phase of an unknown phase voltage relative to a reference phase voltage in an electrical power distribution system having a poly phase power line.

BACKGROUND

Modern power distribution systems use poly phase power lines for distributing electricity. A poly phase power line comprises a plurality, typically three, conductors, each conductor carrying a specified phase voltage. As is well known, a poly phase powder line may or may not have a neutral conductor which, if present, constitutes an additional conductor of the poly phase power line. Moreover, in addition to these conductors of a typical poly phase power line, there may or may not be a further conductor which carries the ground potential.

While a poly phase power line offers advantages for certain types of loads, e.g. electrical machines employing rotating magnetic fields, there are many electrical consumers which are not connected to all the phases available in a given poly phase power line. For many types of loads it is sufficient that the load is connected between two of the phases, or more typical, between one of the available phases and the neutral conductor. This wiring scheme is widely spread particularly in the low voltage networks used for supplying consumer appliances with electricity in the domestic domain. In Europe, the low voltage power distribution network has three wiring phases, each at a voltage of 220 Volt to 240 Volt to neutral, the three phases being spaced apart at an angle of 120°.

Particularly in the domestic domain, most electrical loads are connected between one of the three wiring phases R, S, T and the neutral conductor N, the particular phase R or S or T to which the load is actually connected, being insignificant for most types of single phase applications and loads, and therefore typically unknown. It has to be noted that there exists a variety of different naming conventions for the three wiring phases of a three phase power line. The naming convention R, S, T herein used shall not result in any loss of generality.

In some cases it is desirable to detect the wiring phase to which a given load is connected. For example, in a power line communication system that uses the existing power distribution network for telecommunication purposes, it may be highly desirable for the transmitter to know the wiring phase to which the receiver is connected, because it may be expected that the communication between the transmitter and the receiver via a power line is better if the transmitter and the receiver are connected to the same wiring phase than if the transmitter and the receiver communicates with each other across different wiring phases through capacitive or inductive cross talk between the wiring phases. If the meters communicate with other nodes in a remote metering system through power line communication, the knowledge of the phase to which the respective remote meter at the consumer premises are connected, is valuable information for optimising the communication performance of the remote metering system as a whole.

In an electricity metering system for metering the electric energy consumed by a plurality of consumers, there are other good reasons to detect the wiring phase of an electricity meter located inside or outside of the consumer premises. For example, a single phase or poly phase electricity meter may have been rewired by connecting its ground terminal to a wiring phase for supplying the consumer. The detection whether the wiring phase of the meter has been inverted, allows to judge whether the electricity meter has been rewired unlawfully or unintentionally such that the meter does not correctly measure the consumed energy.

From U.S. Pat. No. 4,626,622 it is known to identify an unknown wiring phase within a poly phase network by comparison of the unknown phase with a known reference phase of the poly phase network. The system comprises a first device connected to the reference phase at a first location and a second device connected to the unknown phase at a remote location. The first and second devices each comprise a modem for establishing a telephone connection between the two devices. The first device includes circuitry to produce a digital alternating signal representative of the phase of the alternating voltage of the reference phase. This representative signal is transmitted through the two modems and the telephone connection from the first to the second device. The second device includes a phase detection circuit for identifying the unknown phase by detecting the phase angle between the alternating voltage of the reference phase and the alternating voltage of the unknown phase. Although this known system allows detection of the wiring phase at the remote location relative to a reference phase at a reference location, it is not practical for many applications as it assumes the existence of a telephone line between the two locations.

The IEC 61334-5-2 defines a method for identifying an unknown phase within a poly phase network by means of injecting a short time stamp signal into the poly phase network when a first reference point, e.g. a zero crossing, occurs in the reference phase voltage. The poly phase network itself serves to communicate the short signal to the location where the unknown phase has to be identified. At the location of the unknown phase, the short signal is extracted from the poly phase power line, and a time interval between the occurrence of the short signal and a reference point, e.g. a zero crossing in the unknown phase voltage is measured. That time interval is then indicative of the phase angle between the reference phase and the unknown phase. The phase angle thus determined allows to identify the unknown wiring phase.

The known methods have in common that reference phase synchronous signals are carried from the location of known phase, herein also called reference location, to the location of unknown phase, herein also called remote location. The remote location compares the received signal phase with the unknown phase to which it is connected, in order to detect its wiring phase. If the phase information is corrupted due to noise or other disturbances, a proper detection of the phase may turn out to be difficult to achieve. Many types of electrical loads connected to the power line tend to generate noise or disturbances in synchronism with the phases to which they are connected. Accordingly, phase synchronous noise signals may interfere in the known method with the short reference phase synchronous signals used for phase detection such that the detection of the reference phase synchronous signals may be impeded. This may become more severe for longer distances between the reference location and the remote location.

SUMMARY

It is an object to provide a method and system for detecting the wiring phase of an unknown phase voltage relative to a reference phase voltage in an electrical single phase or polyphase power distribution system, which does not require the transmission of short time stamp signals in synchronism with the reference phase.

This object is achieved as defined in the independent claims. Advantageous non-limiting example embodiments are given in the dependent claims.

A system for detecting the wiring phase of an unknown phase voltage relative to a reference phase voltage in an electrical power distribution system having a single phase or polyphase power line comprises a circuit for transmitting a signal from a first location to a second location, said signal comprising a characteristic signal pattern. A circuit is provided for determining at said first location a first time interval between the characteristic signal pattern and the occurrence of a reference point in a first phase voltage at said first location. Moreover, the system comprises a circuit for detecting at said second location the characteristic signal pattern of said signal and for determining a second time interval between said characteristic signal pattern and the occurrence of a reference point in a second phase voltage at said second location. The system furthermore comprises a circuit for determining from said first and said second time intervals the wiring phase of the unknown phase voltage among the first and second phase voltages relative to the other phase voltage serving as the reference phase voltage among the first and second phase voltages.

The first phase voltage at the first location from which said signal is transmitted, may be taken as the reference phase voltage, while the phase voltage at the second location may be the unknown phase voltage the wiring phase of which relative to the first phase voltage is to be detected. Alternatively, the second phase voltage at said second location receiving said signal may be taken as the reference voltage while the first phase voltage at said first location is the unknown phase voltage to be detected. In the following, the location having the reference phase voltage will be called reference location while the location where the unknown phase voltage is detected, will be called remote location. It will be appreciated that either the first or the second location can be the reference location and that accordingly, either the second or the first location can be the remote location.

In a constellation wherein the reference location is the first location transmitting said signal, the circuit for determining the wiring phase can be located at said reference location. According to this embodiment the system advantageously comprises means for transmitting information indicative of said second time interval from said remote location to said reference location. Alternatively, the circuit for determining the wiring phase can of course be located at said remote location receiving said signal, and means are provided for transmitting information indicative of said first time interval from said reference location to said remote location. It can be advantageous to additionally include in the information transmitted from the reference location an identification of the phase used at the reference location as the reference phase. This allows the remote location to identify the unknown phase even if there is no a priori knowledge at the remote location which phase is used at the reference location as the reference phase.

In another constellation, wherein the reference location is the second location, the circuit for determining the unknown wiring phase can again be located at the reference location. According to this embodiment the system advantageously comprises means for transmitting information indicative of said first time interval from said remote location to said reference location. Alternatively, the circuit for determining the wiring phase can of course be located at said remote location transmitting said signal, and means are provided for transmitting information indicative of said second time interval from said reference location to said remote location. It can be advantageous to additionally include in the information transmitted from the reference location an identification of the phase used at the reference location as the reference phase. This allows the remote location to identify the unknown phase even if there is no a priori knowledge at the remote location which phase is used at the reference location as the reference phase.

The wiring phase of the unknown phase voltage may be determined from said first and said second time intervals by calculating the difference between said second time interval and said first time interval. This difference can then be used for example to look up a table which associates various difference values with one out of a given number of possible phase angles.

Since the characteristic signal pattern does not need to function as a time stamp synchronous with a reference point in the reference phase, the characteristic signal pattern can but need not be short. The characteristic signal pattern in the transmitted signal may even have a duration as long as or longer than the period of the alternating voltage on the power line. This allows to obtain a characteristic signal pattern with high signal energy which can be more easily distinguished from noise and interference caused by loads connected to the power line. The characteristic signal pattern may advantageously be detected by means of analogue or digital correlation techniques or using matched filters. The characteristic signal pattern may be error correction coded and detected using error correction decoding techniques. Of course, other detection techniques are equally applicable to the present invention.

According to an example embodiment, the transmitted signal is not a dedicated signal for phase detection but is used to transmit other information along the power line. The characteristic signal pattern can be a predetermined symbol sequence or bit sequence which occurs at random in the signal, or the characteristic signal pattern may be a unique code word, for example a unique sequence of a plurality of transmitted bits or symbols which can be contiguous or non-contiguous within the signal and which may be provided at the beginning of the signal or at any other location in the signal as desired. It may be advantageous to use error correction coding techniques and/or interleave portions of the characteristic signal pattern with other portions of information carried by the signal, in order to protect the characteristic signal pattern against noise or other disturbance on the power line and to increase the reliability of its detection. A header portion preceding the characteristic signal pattern may be provided in the signal, for example to facilitate symbol synchronisation for the characteristic signal pattern detection circuitry. The header portion may also be a signal portion which carries other information from the reference location to the remote location.

Preferably, detection circuits for detecting the characteristic signal portion are provided both at the first location and at the second location. Preferably, the detection circuits at both locations are similar or operate in a similar way. This allows to easily achieve synchronism in detecting the occurrence of the characteristic signal portion at both locations, regardless how long the detection process actually takes.

The signal comprising the characteristic signal portion may be a sequence of symbols, e.g. bits, with a predetermined symbol frequency, and the circuits for determining a first time interval and second time interval, respectively, may exploit the symbol frequency for counting the number of symbols between the detected characteristic signal pattern and the occurrence of a reference point in said unknown phase voltage and a reference point in said reference phase voltage, respectively. Alternatively, a free running counter may be clocked at a predetermined clock frequency. The counter is started upon the detection of said characteristic signal pattern and a value counted by said counter is read when a said reference point has occurred. Any other means for detecting the time interval between a characteristic signal portion and a reference point may of course, be adopted.

Preferably, the signal is transmitted such that the characteristic signal pattern does not have a regularly timing relationship with any of the reference points repetitively occurring in said phase voltages of said polyphase power line. For example, the characteristic signal pattern is transmitted at a random or pseudo random timing.

Preferably, a plurality of said characteristic signal patterns are repeatedly transmitted at random or at deterministic timings and/or in different portions of the spectrum and/or spread spectrum modulated with different spreading codes to achieve redundant transmission of the characteristic signal pattern, and for each of the plurality of transmitted characteristic signal patterns, a first time interval is determined at said first location between the characteristic signal pattern of the signal and the occurrence of a reference point in said first phase voltage, and a second time interval is determined at said second location between the characteristic signal pattern and the occurrence of a reference point in said second phase voltage, such that a plurality of first time intervals and associated second time intervals is obtained. This allows to increase the reliability of the wiring phase detection, e.g. by selecting that wiring phase which has a majority among the plurality of first and associated second time intervals thus obtained. The majority may be a M/(M+1) majority, M being an integer equal to or larger than 2, such that one out of M errors in detecting the first and associated second time interval would not affect the correctness of the detected wiring phase.

Preferably, in order to lower any correlation between the occurrence of the characteristic signal pattern and phase synchronous disturbances on the power line, said signals are transmitted such that a time interval between two successive characteristic signal patterns is larger or smaller than the alternating voltage period of said polyphase power line and unequal to integer multiples of said alternating voltage period.

Preferably, the reference points in the unknown phase voltage and in the reference phase voltage, respectively, are unique points in each period of the respective phase voltage specified by their voltage and/or slope, for example zero crossings of the respective phase voltages with a slope of specified sign, or peak voltages of specified polarity. The first time interval and said second time interval, respectively, ends with the Nth reference point following the characteristic signal pattern, N being a predetermined positive integer equal to or preferably larger than 1. A particularly suitable value for N is 1 or 2.

Preferably, said signal is a frequency shift keying (FSK) modulated signal injected at said first location into at least one phase or preferably all phases of the poly phase power line (L), between the respective phase and the neutral conductor or between two of the phases. Alternatively, the signal may be transmitted over a radio communication channel or over a telephone network. It may be advantageous to embody the signal as a Dual Tone Multiple Frequency (DTMF) signal, to increase its immunity against harmonic noise.

It should be noted that the following description serves the sole purpose of illustrating an example. The example embodiment described should not be construed as limiting.

BRIEF DESCRIPTION OF DRAWINGS

FIG. 1 shows a basic outline of an example embodiment;

FIG. 2b shows an example of a signal used in the embodiment shown in FIG. 1;

FIG. 5 shows a timing diagram to illustrate the phase detection operation of the circuit shown in FIG. 3.

DETAILED DESCRIPTION

Figure 2A:
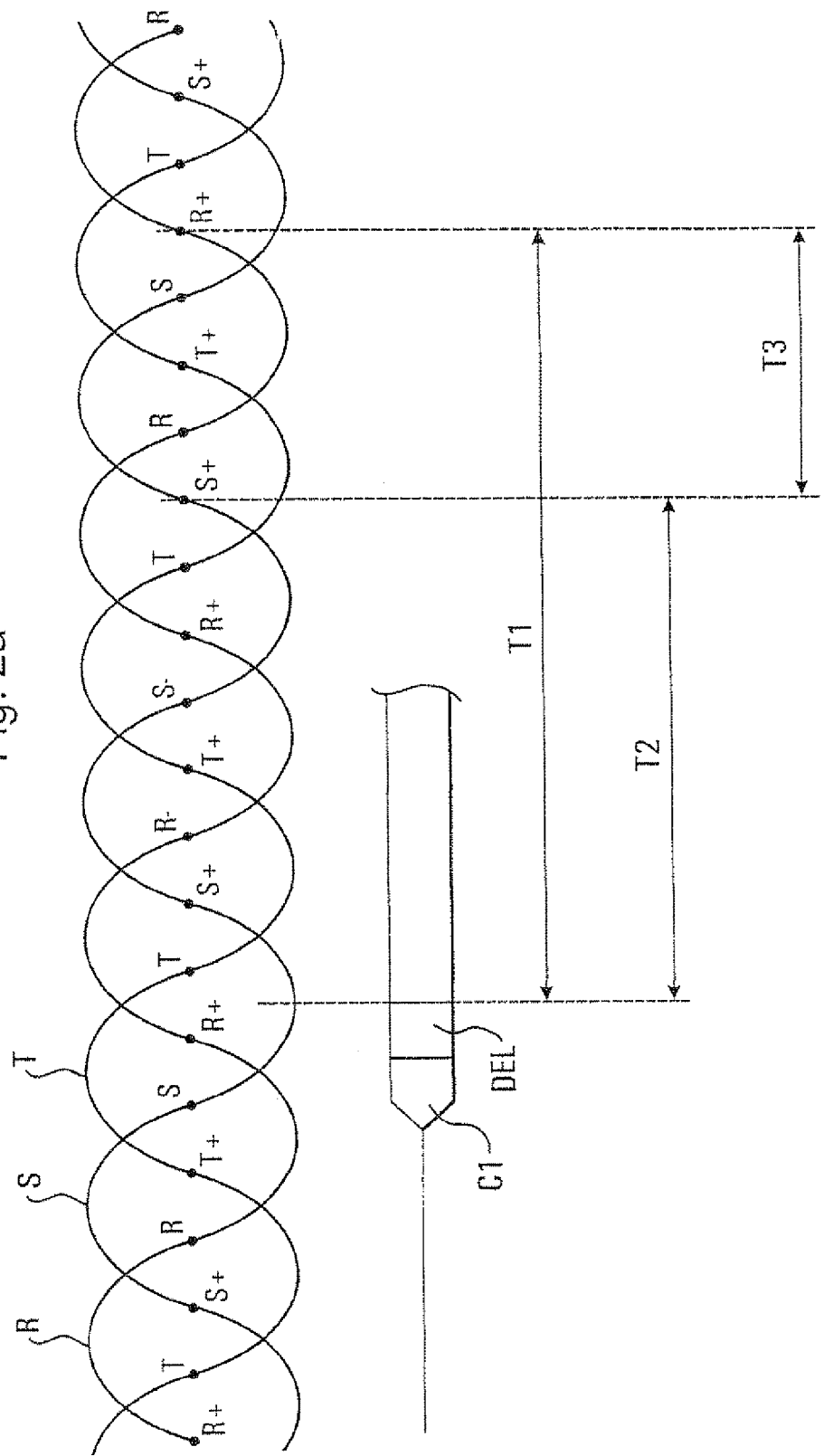
FIG. 2a shows a timing diagram to illustrate a basic operating principle of the example embodiment shown in FIG. 1.

FIG. 1 shows a basic outline of an example embodiment. In FIG. 1, L denotes a three-phase power line. The power line L comprises three conductors R, S and T each carrying a specified phase voltage relative to the neutral conductor N of the power line L. The power line L may furthermore comprise a ground conductor which is not shown in the diagram of FIG. 1. The phase voltages respectively carried on the three conductors R, S and T may be 220 Volt to 240 Volt as frequently used in Europe in the domestic domain, or 110V as commonly used in the USA. It has to be noted, however, that the present invention would be equally applicable to power lines L in a medium voltage power distribution network which carries e.g. 20 kV, or even in the high voltage power distribution network which carries electricity over long distances at a voltage level of 380 kV or even higher. As well known in three phase power distribution networks, the voltages carried on the three phases R, S and T differ from each other by a phase angle of 120°.

Reference numeral 100 in FIG. 1 denotes a device at a first location which is connected to each of the three phase wirings R, S and T of the power line L as well as to the neutral conductor N of the power line L. In this embodiment, the first location is taken as the reference location wherein R is used as the reference phase. Of course, any one of the three phases could be taken as the reference phase. The device 100 at the reference location may be a communication node in a power line communication network which uses the power line as the physical information transmission medium. The device 100 can be arranged e.g. close to a secondary substation transformer for transforming the medium voltage of 20 kV of the power distribution network into the low voltage of 220 to 240

V, or at any other location along the power line L where one of the three phases R, S and T is available for selection as a reference phase. At the substation transformer, the naming of the three phases R, S, T is simply a matter of definition. As long as the phase sequence of the voltages at the three phase outlets is observed, anyone of the three phases can be named R. That wiring phase which carries a voltage with a phase angle of 120° behind the phase voltage R, is then named S, and the phase voltage which is 240° behind the voltage R, is named T. Of course, any other naming convention to distinguish the three phases may be used instead. In the embodiment of FIG. 1, the device 100 is connected to each of the three phases R, S and T in order to be able to inject a power line communication signal into each of the three phases for transmission over the power line L such that the power line communication signal can be received at a remote location on any of the three phases R, S and T. It may be sufficient, however, to inject the power line communication signal into one of the three phases only, and to exploit inductive and capacitive cross coupling between the three phases when receiving the power line communication signal from another one of the three phases.

Reference numeral 200 denotes a further device at a second location which may be a further node in the power line communication network on the power line L. In this embodiment, the second location is the remote location where the wiring phase is unknown. The device 200 may comprise a load or may be a remote meter for measuring the electricity consumption of a consumer, a test device dedicated to phase detection, or any other suitable device. It is connected to the power line L at a location remote from the reference location. In the embodiment shown, the device 200 is connected between one of the phases and the neutral conductor N of the power L. At the remote location of the device 200, when looking at the phase conductors of the power line L alone, no information is available, to which of the three outlets R, S and T at the secondary substation the device 200 is connected. This is schematically depicted in FIG. 1 by means of the circle X. This circle indicates that in many cases it cannot be traced easily how exactly the three phases R, S and T are wired along the way from the reference location of the device 100 to the remote location of the device 200. For example, the portion X of the power line L may be buried or in any other way inaccessible, or it may simply be too long to trace the exact wiring of the three phases R, S and T.

In order to find out the wiring phase of the device 200 at the remote location, in other words, in order to detect which of the three phases R, S and T the device 200 at the remote location is connected to, the two devices 100 and 200 communicate with each other in a manner shown in FIG. 2a.

In FIG. 2a, R, S and T respectively denote the three phase voltages, wherein the phase voltage S is 120° behind R, and the phase voltage T is 120° behind S. R+, S+ and T+ denote zero crossings of the respective phase voltages R, S and T with a positive slope. R−, S− and T− denote zero crossings in the respective phase voltages R, S and T with a negative slope.

C1 in FIG. 2a denotes a signal which the device 100 of FIG. 1 injects into at least one of the three conductors R, S and T of the power line L. FIG. 1 shows an embodiment wherein the signal C1 is injected into all phase conductors of the power line. However, due to cross coupling effects between the phase conductors R, S and T along the power line it may be sufficient to inject the signal C1 into one of the phase conductors only. It may also be advantageous to inject the signal C1 sequentially one by one in a trial and error fashion into each of the three phase conductors and concentrate the injected signal power on the respective conductor to thus extend the range of the signal C1 along the power line. The signal C1 may be any communication signal for carrying any kind of information across the power line communication network. The signal C1 can be a communication signal not specifically dedicated to the detection of the wiring phase of the device 200 at the remote location. The signal C1 comprises a characteristic signal pattern denoted DEL in FIG. 2a. The device 100 injects the signal C1 into the power line at a timing which can be but need not be synchronized with any of the zero crossings of the three phases R, S and T. The signal C1 may begin at any time unrelated to the 50 Hz cycle on the power line L and may e.g. be determined by communication needs between the two devices 100 and 200 or between the device 100 and any other device connected to the power line L.

In FIG. 2a, T2 notes the time interval between a characteristic signal pattern DEL in the signal C1 and the subsequent occurrence of the Nth zero crossing with a positive slope in the unknown wiring phase to which the device 200 at the remote location is connected. N has been chosen as 2 to avoid that the time interval T2 becomes very short, although other values for N, including N=1, would of course be possible. In the example shown in FIG. 1, it is indicated for the purpose of illustration that the device at the remote location 200 is connected to the phase S. As shown in FIG. 2a, the time interval T2 ends at the second zero crossing S+ following the characteristic signal pattern DEL transmitted by the device 100 at the reference location along the power line L to the remote location. The device 200 at the remote location detects this time interval T2.

T1 in FIG. 2a denotes the time interval between the occurrence of the characteristic signal pattern DEL in the signal C1 and the Nth zero crossing with positive slope of the reference phase. In the example shown, R has been chosen as the reference phase. Similar to what has been described with regard to the device 200 measuring the time interval T2, the device 100 at the reference location measures the time interval T1.

The time interval T3 denotes the difference between the time interval T1 and the time interval T2. This difference is indicative of the unknown phase, S in the example shown, relative to the reference phase R in the example. Once the information T3 is available, the unknown phase can be identified. In order to obtain the time difference T3, in this embodiment the device 200 transmits information about the duration T2 detected by the device 200 to the device 100 at the reference location such that the device 100 can obtain the difference T2−T1 and thus identify the unknown phase S at the remote location. According to an alternative embodiment, the device 100 at the reference location transmits information about the duration of the time interval T1 to the device 200 at the remote location and the device 200 then obtains T3 from the difference between T2 and T1 in order to identify its wiring phase relative to the reference phase R. Which of these alternative embodiments is preferred depends on whether the phase detection information is required at the remote location or at the reference location.

The information regarding the duration of the respective time interval T2 and T1, respectively, can be transmitted in any suitable way from one location to the other. For example, this information can be transmitted in a digitally coded format as a network communication message using the power line as the transmission medium. No particular timing constraints have to be observed when transmitting this information from one location to the other. As soon as the information has been transmitted such that durations T1 and T2 are available at the same location, the difference T3 can be calculated and the unknown phase wiring can be detected.

FIG. 2b shows an example of the structure of the signal C1 transmitted by the device 100 at the reference location. According to the example shown in FIG. 2b, the signal C1 is a digital network communication signal transmitted e.g. by means of frequency modulating (FSK) a carrier suitable for power line communication, as is well known as such. The signal C1 extends over one or more AC cycles on the power line and comprises a preamble PRB followed by a start frame delimiter DEL which is used to delimit the subsequent information portion from the preamble portion of the signal C1. This start frame delimiter is a characteristic signal pattern in the signal C1 which can be used for determining the time intervals T1 and T2 described with reference to FIG. 2a. The information portion following the start frame delimiter DEL can be structured in any suitable way, e.g. in accordance with a suitable power line communication network protocol. In the example shown, LT denotes the frame length of the signal C1, followed by the MAC address IND, a control field CTL, repetition parameters PR for redundant transmission of the signal C1 in the power line communication network, followed by the actual information field, e.g. a MAC service data unit, which is then followed by a CRC check field and an end frame delimiter EFD. The information about the time interval T1 detected by the device transmitting the signal, can be included at a suitable position within the signal C1, for example in the information field INF or in a dedicated field (not shown) which comes late enough in the signal C1 for the time interval T1 to be over and thus available. It may be located for example before the PR field or between the PR field and the INF field. It has, however, to be noted that the signal format shown in FIG. 2b is one example taken from a large variety of different signal formats and protocols which can be used in a power line communication network. Any characteristic signal pattern like the start frame delimiter DEL or end frame delimiter EFD can be used for measuring the time intervals T1 and T2 shown in FIG. 2a. Of course, instead of using a frame delimiter, a dedicated characteristic signal pattern can be included e.g. in the information field INF or in the control field CTL or at any other location within the signal frame C1. The characteristic signal pattern may be a unique code word or bit sequence in the signal C1. Also, the characteristic signal pattern may appear in the signal with or without error correction coding. If the characteristic signal pattern appears in the signal C1 in an error correction coded form, the reliability of the detection of the characteristic signal pattern may be increased further.

Figure 3:
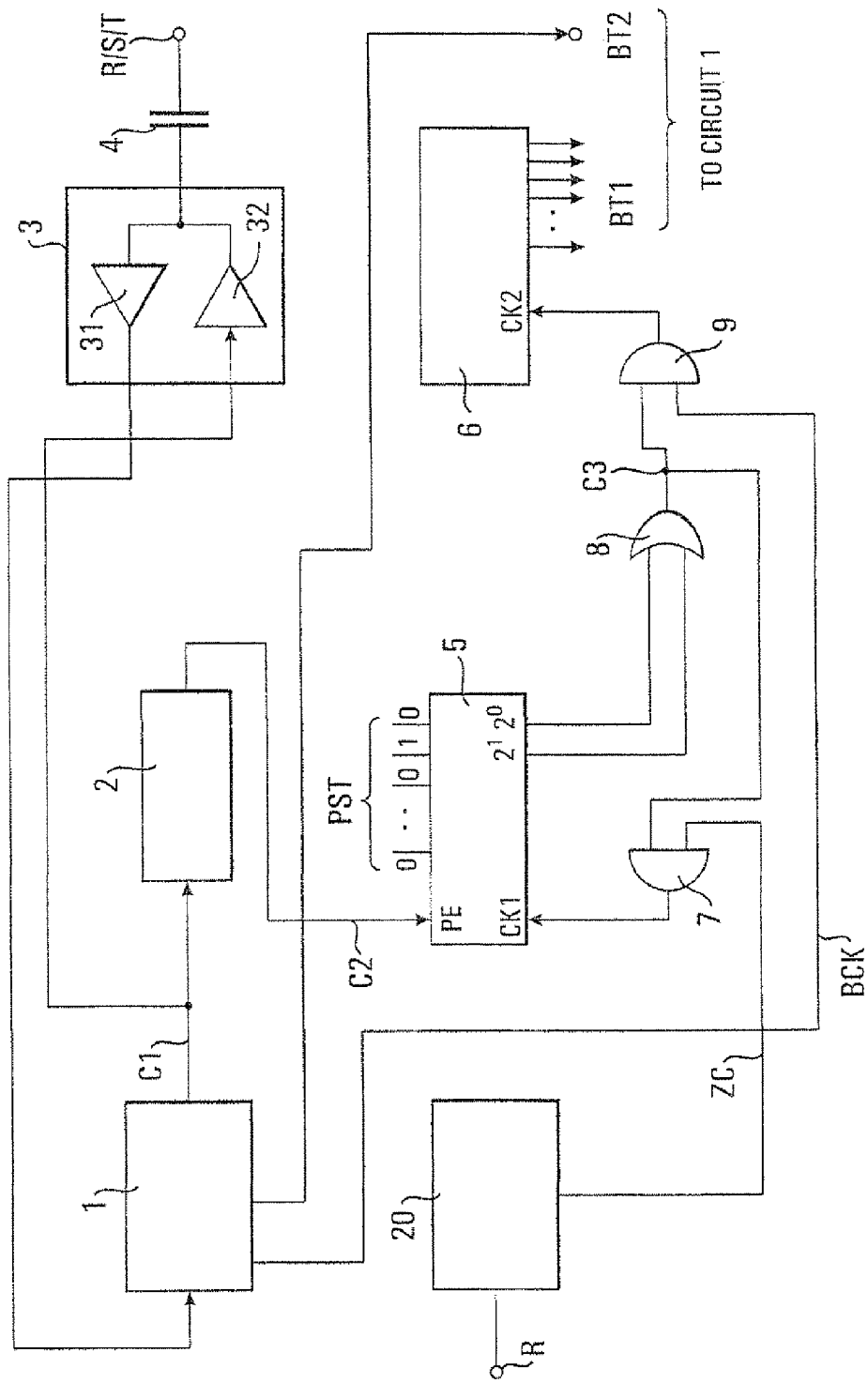
FIG. 3 shows a block diagram of an example embodiment of a network node in a power line communication system for performing a phase detection operation.

FIG. 3 shows a block diagram of components in the device 100 shown in FIG. 1 for transmitting the signal C1 at the reference location. Preferably, similar components are provided also in the device 200 at the remote location for detecting the characteristic signal pattern and for measuring the time interval T1.

In FIG. 3, reference numeral 1 denotes a digital communication circuit including a micro processor executing programs for transmitting, receiving, generating and processing network messages in the power line communication network. The internal structures of a communication circuit of this kind are not essential for the embodiment shown. They depend on the individual purpose and functions of the power line communication network and are well known as such. The digital communication circuit has means, for example an output port of the micro processor, for generating a signal C1 comprising a characteristic signal pattern for transmission over the power line L. 2 denotes a circuit for detecting the occurrence of the characteristic signal pattern in the signal C1, as will be explained in greater detail with reference to FIG. 4a below. C2 denotes an output signal of the characteristic signal pattern detector 1 which signal C2 indicates the occurrence of the characteristic signal pattern in the signal C1. Reference numeral 3 denotes a transceiver circuit having a transmitter amplifier 32 and a receiver circuit 31 which are connected to the power line via a coupling capacitor 4 or any other suitable means for isolating the transceiver circuit 3 from the power line without blocking the transmission of communication signals between the power line and the transceiver circuit 3. The transmitter 32 amplifier takes the digital signal C1 from the communication circuit 1 and modulates this signal on a suitable carrier for transmission. The receiver 31 receives power line communication signals through suitable filter means, performs a suitable demodulation operation and presents a data signal to the communication circuit 1 for further processing. In the device 100 at the reference location, the transceiver 3 is preferably connected to at least one of the three conductors R, S and T in order to make the power line communication signals transmitted by the circuit 100 available on the three phases, as explained above. 20 denotes a zero crossing detector which is connected to the reference phase R. This detector may be implemented simply by means of a comparator which compares the input phase signal to zero in order to output a rectangular signal in synchronism with the phase signal at its input.

Reference 5 denotes a pre-settable counter which performs a down counting operation in accordance with a clock signal at the input CK1 of the counter 5. PST denotes inputs of the down counter 5 for programming a start value for the counter 5 for counting down. The start value in binary representation present at the preset inputs PST is loaded into the counter in accordance with a preset enable signal at the input PE of the counter 5. $2^0$ and $2^1$ denote the two least significant bits of the output of the counter 5. Reference numeral 6 denotes a further counter which performs a counting operation of clock pulses applied to the input CK2 of the counter 6. BT1 denotes the output of the counter 6 which is a binary representation of the duration of the time interval T1. Reference numerals 7 and 9 denote AND gates whereas reference numeral 8 denotes an OR gate. A first input of the AND gate 7 receives a signal ZC from the zero crossing detector 20. The other input of the AND gate 7 is connected to the output of the OR gate 8 to receive a signal C3. The output of the AND gate 7 is connected with the clock input CK1 of the counter 5. The two inputs of the OR gate 8 are connected with the two least significant bits $2^0$ and $2^1$ of the output of counter 5. The AND gate 9 receives a bit clock signal BCK generated by a clock recovery circuit (not shown) in the communication circuit 1 from the signal C1 in a conventional manner well known as such. The other input of the AND gate 9 receives the output signal C3 of the OR gate 8. The output of the AND gate 9 is connected with the clock input of the counter 6. BT2 denotes information about the duration of the time interval T2 detected by the device 200. In this embodiment, this information is received via the power line communication network through the receiver 31 from the device 200 at the remote location.

The information BT1 and BT2 is suitably processed in a circuit not shown in FIG. 3 in order to map this information onto a phase value relative to the reference phase which is indicative of the unknown phase to which the device 200 is connected, or directly onto one of the three phases R, S and T. This operation can be embodied in a variety of different ways. Preferably, a difference between BT1 and BT2 is calculated and a look up table is used to look up the wiring phase depending on the difference between BT1 and BT2. In the embodiment shown, the bit clock frequency has been chosen to be 48 bits per 20 ms AC cycle. The look up table then contains the following entries:

| Entry | BT1 – BT2 | wiring phase of remote node 200 |
|---|---|---|
| 1 | 0 ± 3; 48 ± 3; –48 ± 3 | same as reference phase |
| 2 | 8 ± 3; –40 ± 3 | 60° ahead of reference phase |
| 3 | 16 ± 3; –32 ± 3 | 120° ahead of reference phase |
| 4 | 24 ± 3; –24 ± 3 | 180° ahead of reference phase |
| 5 | 32 ± 3; –16 ± 3 | 240° ahead of reference phase |
| 6 | 40 ± 3; –8 ± 3 | 300° ahead of reference phase |

In this table, the entries 1, 3 and 5 indicate that the remote device 200 is connected to one of the three wiring phases of the power line. The entries 2, 4 and 6 indicate inverse wiring phases of the remote unit 200 wherein the phase terminal of the remote device 200 has been connected to neutral whereas the neutral terminal of the remote device 200 has been connected to one of the wiring phases of the power line. The processing circuit for performing this look up table operation to map BT1-BT2 onto one of the entry numbers 1 to 6 may be comprised in the communication circuit 1. Other implementations to obtain the unknown wiring phase of the device 200 may, of course, be adopted.

Figure 4A:
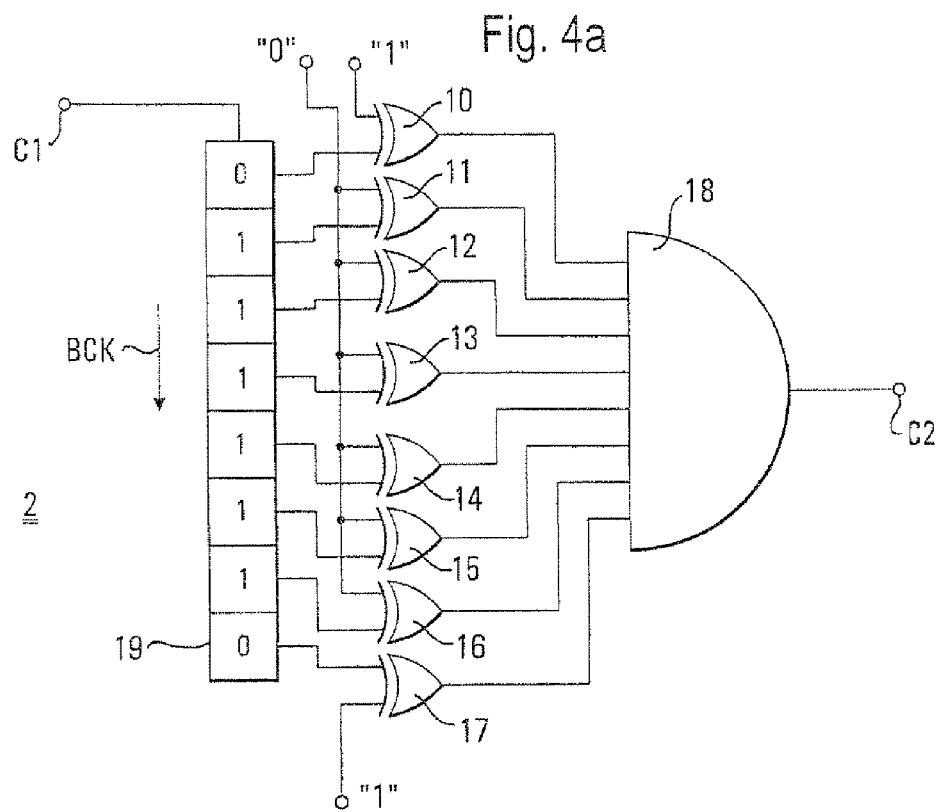
FIG. 4a shows a block diagram to illustrate the internal structure of the characteristic signal pattern detector 2 shown in FIG. 3.

FIG. 4a shows an embodiment of the characteristic signal pattern detector 2. In FIG. 4a, reference numeral 19 denotes a shift register having eight taps in the example shown. Of course, other numbers of taps, e.g. 12 taps, would be equally suitable, depending on the number of bits forming the characteristic signal pattern to be detected. Data are shifted in the shift register 19 from the top of FIG. 4a to the bottom as indicated by the arrow, in accordance with the bit clock BCK. The shift register 19 maintains in the eight tap positions the history of the eight most recent bits transmitted in the signal C1, the present bit being maintained in the uppermost position shown. In FIG. 4a a particular state of the shift register 19 is shown for the purpose of illustration. In the state shown, the oldest bit as well as the present bit is "0" whereas the six bits in between are "1". This bit pattern is the start frame delimiter DEL used in the signal C1 which is also used as the characteristic signal pattern. Accordingly, for the purpose of illustration, FIG. 4a shows the state of detecting the characteristic signal pattern. Of course, this state will change with the next bit clock impulse BCK. The reference numerals 10 to 17 denote Exclusive OR (EXOR) gates, each having two inputs. One of the two inputs of each of the EXOR gates 10 to 17 is connected with an associated one of the eight output taps of the shift register 19. The EXOR gate 10 having one of its inputs connected to the uppermost tap of the shift register holding the present bit, has its other input connected to a signal with logical level "1". The same applies to the EXOR gate 17 which has one of its inputs connected to the tap holding the oldest one of the eight bits in the shift register 19. The inputs of the other EXOR gates 11 to 16 not connected with the shift register, are connected to a signal with a logic level of "0". In this way, the characteristic signal pattern detector 2 has been programmed to be able to detect the particular pre-determined characteristic signal pattern 01111110. The outputs of the EXOR gates 10 to 17 are connected to respective inputs of an AND gate 18. The output of the AND gate 18 bears the reference numeral C2. This output indicates the occurrence of the characteristic signal pattern in the signal C1. Of course, the characteristic signal pattern 01111110 is an example only. Other implementations of the characteristic signal pattern both in respect of its length and in respect of its bit sequence are, of course, possible.

Figure 4B:
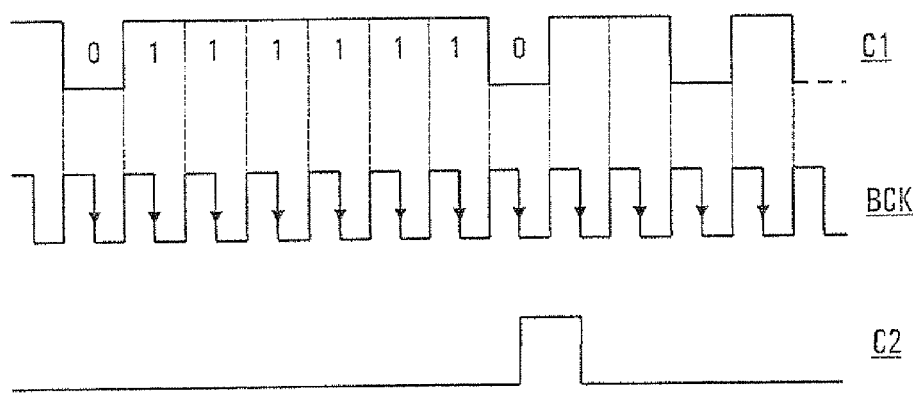
FIG. 4b shows a timing diagram to illustrate the operation of the signal pattern detector circuit.

In operation, the characteristic signal pattern detector shown in FIG. 4a continuously shifts the sequence of incoming bits of the signal C1 through the shift register 19. The chain of EXOR gates 10 to 17 examines the bit pattern stored in the shift register 19 as to whether this bit pattern matches with the inverse of the bit pattern present at the respective other inputs of the EXOR gates 10 to 17. Only if perfect match is given, the pairs of inputs of all EXOR gates 10 to 17 have different logic levels and all outputs of the EXOR gates 10 to 17 according have a logic signal level of "1", such that the output C2 of the AND gate 18 takes a logic "1" value. FIG. 4b shows a timing diagram to illustrate the signal C1, the bit clock BCK and the output signal C2 of the characteristic signal pattern detector of FIG. 4a.

FIG. 5 shows a timing diagram to illustrate the operation of the circuit shown in FIG. 3. As shown in FIG. 5, an impulse occurs in the signal C2 when the circuit 2 detects the occurrence of a characteristic signal pattern in the signal C1. This impulse C2 appears at the preset enable input of the counter 5 and presets the counter to a value N defining the number of reference points between the occurrence of a characteristic signal pattern and the end of the time interval T1. This number N of reference points can be 1 or larger than 1, e.g. N=2, in order to ensure that the time interval T1 measured by the circuit in FIG. 3 has a certain length even if the characteristic signal pattern occurs close to the reference point detected by the circuit in FIG. 3.

The signal ZC in FIG. 5 is the output signal of the zero crossing detector indicating the occurrence of zero crossings in the reference phase R. The OR gate 8 in the circuit of FIG. 3 keeps the signal C3 at a logic "1" level as long as the down counter 5, after having been preset by virtue of the impulse of signal C2, has not reached the value zero. Since the embodiment shown in FIG. 3 uses the value N=2, a simple OR gate is sufficient to generate this signal C3 which takes a logic one level beginning with the occurrence of a characteristic signal pattern and ending with the down counter 5 reaching zero. As long as C3 is at a logic 1 level, the impulses from the zero crossing detector 20 appear at the clock input CK1 of the down counter 5, by virtue of the AND gate 7. The two output signals $2^0$ and $2^1$ shown in FIG. 5 indicate what happens at the output of the down counter 5 in response to the signal C2 at the preset enable input PE. As long as the signal C3 is on a logical 1 level, the AND gate 9 provides at its output the gated bit clock BCK from the bit clock recovery circuit which causes the counter 6 to perform a counting operating, such that the counter 6 performs the measurement of the time interval T1 between the occurrence of the characteristic signal pattern and the subsequent occurrence of a second reference point in the reference phase voltage. As shown in FIG. 5, during this operation of measuring the duration of the time interval T1, two clock edges appear at the clock input CK1 of the down counter 5. The duration of the logic 1 state in the signal CK1 after the second clocking edge is very short, due to the fact that the transition in the output $2^0$ from "1" to "0" in response to the second clocking edge causes the signal C3 to take a logic 0 level, such that the output of AND gate 7 also goes logic "0".

The circuit and its operation described with reference to the FIGS. 3, 4a, 4b, 5 are provided in the device 100 shown in FIG. 1. A similar circuit is provided in the device 200 of FIG. 1 wherein the input of the zero crossing detector 20 is connected to the unknown phase rather than to the reference phase R as shown. The time interval counted by the counter 6 in the device 200 is T2. The device 200 furthermore differs from the circuit in the device 100 shown in FIG. 3 in that information obtained by the counter 6 about the duration of the time interval T2 is supplied to the communication node 1 for transmission in the form of an explicit message to the device 100. There is no need to provide means for calculating a difference between T1 and T2 in the device 200. These adaptations of the circuit shown in FIG. 3 for the device 200 are minor modifications which are immediately apparent from the above description of the structure and function of the embodiment.

The first and second locations can be nodes in a power line communication system, for example in a power line communication system for remote metering the consumption of electricity. Such system may comprise a plurality of remote electricity meters as well as a concentrator acting as a master in communication with the plurality of remote meters. When a remote meter receives a signal C1 from the concentrator it counts how many bits there are from the characteristic signal pattern to the next (or more generally, Nth) zero crossing of the phase voltage to which it is connected. The meter returns an answer message to the concentrator carrying this information. The concentrator can then determine the difference between the number of bits counted and communicated by the remote meter and the number of bits from the characteristic signal pattern to the next (or Nth) zero crossing counted by the concentrator to find out to which phase the remote meter is connected. If the remote meter receives in the message from the concentrator information about the number of bits the concentrator has counted, the meter can determine its wiring phase from this number and the number of bits it has counted. The meter may communicate the result, for example, one of the numbers 1 to 6 in the above table, to the concentrator to inform the same of the remote meter's wiring phase detected by the remote meter.

It has to be noted that the described embodiments may be modified in various ways. For example, the characteristic signal pattern detection circuit 2 has been shown to perform a matching operation between a pre-programmed bit pattern and the bit sequence in the shift register 19. However, it may be advantageous to use an error correction code for protecting the characteristic bit pattern and to embody the circuit evaluating the content of the shift register 19 as a decoder for decoding the error correction coded characteristic signal pattern, in order to increase the noise immunity of the characteristic signal pattern detector circuit 2. Appropriate error correction coding techniques are well known as such and reference is made to any text book on error correction codes and their application. Also, it has to be noted that the circuit shown in FIG. 3 for measuring a time interval between the occurrence of a characteristic signal pattern in the signal C1 and the occurrence of an Nth reference point in the reference phase and the unknown phase, respectively, is one example out of a large variety of different circuits which can be used to perform this time interval measurement. While the embodiment shown in FIG. 3 uses the bit clock in the signal C1 to measure the time interval T1 and T2, respectively, a free running clock signal generator could be used instead for generating the clock signal counted by the counter 6.

The invention claimed is:

1. A system for detecting the wiring phase of an unknown phase voltage relative to a reference phase voltage in an electrical power distribution system having a single phase or polyphase power line, comprising:
   transmitting circuitry for transmitting a signal from a first location to a second location, said signal comprising a characteristic signal pattern;
   a measuring circuit for measuring at said first location a first time interval between the characteristic signal pattern and the occurrence of a reference point in a phase voltage at said first location;
   a detecting circuit for detecting at said second location the characteristic signal pattern of said signal and for measuring a second time interval between said characteristic signal pattern and the occurrence of a reference point in a second phase voltage at said second location;
   a determining circuit for determining from said first and said second time intervals the wiring phase of the unknown one of the first and second phase voltages relative to the other one of the first and second phase voltages serving as the reference phase voltage, wherein said determining circuit is located at said first location; and
   logic circuitry for transmitting information indicative of said second time interval from said second location to said first location.

2. The system according to claim 1, wherein said second circuit for determining the wiring phase of the unknown phase voltage from said first and said second time intervals comprises circuitry for calculating a difference between said second time interval and said first time interval and for determining said wiring phase based on said difference.

3. The system according to claim 1, wherein said characteristic signal pattern comprises a unique code word.

4. The system according to claim 3, wherein said signal comprises a header portion preceding the characteristic signal pattern.

5. The system according to claim 1, wherein said characteristic signal pattern to be detected is the beginning of the signal.

6. The system according to claim 1, wherein:
   said signal is a sequence of symbols with a predetermined symbol frequency; and
   said circuits for determining a first time interval and second time interval), respectively, comprise counters for counting the number of said symbols between said characteristic signal pattern and the occurrence of a said reference point in said unknown phase voltage and a said reference point in said reference phase voltage, respectively.

7. The system according to claim 1, wherein said timing circuit for detecting said first time interval comprises:
   a free running counter at a predetermined clock frequency;
   means for starting the free running counter upon detection of said characteristic signal pattern; and
   means for reading a value counted by said counter when said reference point has occurred.

8. The system according to claim 1, wherein said transmitting circuitry is adapted to transmit said signal such that the characteristic signal pattern does not coincide with any of the reference points repetitively occurring in said phase voltages of said polyphase power line.

9. The system according to claim 1, wherein said transmitting circuitry is adapted to transmit said signal such that the characteristic signal pattern has a random or pseudo random timing.

10. The system according to claim 1, further comprising means for
   transmitting a plurality of said characteristic signal patterns at different timings and/or in different portions of the spectrum and/or spread spectrum modulated with different spreading codes; and
   for each of the plurality of transmitted signal patterns, determining at said second location a first time interval between the characteristic signal pattern of the signal and the occurrence of a reference point in said second phase voltage;

determining at said first location a first time interval between the characteristic signal pattern and the occurrence of a reference point in said first phase voltage;

such that a plurality of first time intervals and associated second time intervals is obtained;

said circuit for determining the wiring phase being adapted to determine the wiring phase from said plurality of first and second time intervals.

11. The system according to claim 10, wherein said second circuit for determining the wiring phase from said plurality of first and second time intervals comprises:

means for calculating a difference between each first time interval and its associated second time interval;

means for determining a preliminary wiring phase from each of the differences thus obtained; and means for selecting that wiring phase which has a majority among said preliminary wiring phases thus determined.

12. The system according to claim 11, wherein said majority is a M/(M+1) majority, M being an integer equal to or larger than 2.

13. The system according to claim 10, wherein said signals are transmitted successively such that a time interval between two successive characteristic signal patterns is larger or smaller than the alternating voltage period of said polyphase power line and unequal to integer multiples of said alternating voltage period.

14. The system according to claim 1, wherein said reference points are unique points in each period of the respective phase voltage specified by their voltage and/or slope.

15. The system according to claim 14, wherein said reference points are zero crossings of the respective phase voltages with a slope of specified sign.

16. The system according to claim 14, wherein said first time interval and said second time interval, respectively, end with the Nth reference point following the characteristic signal pattern, N being a predetermined positive integer equal to or larger than 1.

17. The system according to claim 16, wherein N=2.

18. The system according to claim 1, wherein said transmitting circuitry comprises means for injecting said signal into at least one phase of said poly phase power line.

19. The system according to claim 1, wherein said transmitting circuitry comprises a radio transmitter circuit for transmitting the signal over a radio communication channel.

20. The system according to claim 1, wherein said signal is transmitted over a telephone network.

21. The system according to claim 1, wherein said signal is a Dual Tone Multiple Frequency (DTMF) signal.

22. A method for determining the wiring phase of an unknown phase voltage relative to a reference phase voltage in an electrical power distribution system having a single phase or poly phase power line, comprising:

transmitting a signal from a first location to a second location, said signal comprising a characteristic signal pattern;

measuring at said first location a first time interval between said characteristic signal pattern and the occurrence of a reference point in a first phase voltage;

detecting at said second location the characteristic signal pattern and measuring a second time interval between the characteristic signal pattern and the occurrence of a reference point in a second phase voltage; and at said first location, determining from said first and said second time intervals the wiring phase of the unknown one of the first and second phase voltages relative to the other one of the first and second phase voltages serving as the reference phase voltage, and transmitting information indicative of said second time interval from said second location to said first location.

* * * * *